(12) United States Patent
Andric

(10) Patent No.: US 6,392,145 B1
(45) Date of Patent: May 21, 2002

(54) SEMICONDUCTOR DEVICE INCLUDING AND INTEGRATED CIRCUIT HOUSED IN AN ARRAY PACKAGE HAVING SIGNAL TERMINALS ARRANGED ABOUT CENTRALLY LOCATED POWER SUPPLY TERMINALS

(75) Inventor: Anthony Andric, Austin, TX (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/570,159

(22) Filed: May 11, 2000

(51) Int. Cl.⁷ .......................... H01L 23/02; H05K 1/16; H05K 7/02
(52) U.S. Cl. ...................... 174/52.4; 174/260; 361/760; 361/764
(58) Field of Search ................................ 174/52.1, 52.4, 174/255, 260, 262, 263; 257/691, 692, 697, 398, 700, 713, 773, 774, 778; 361/748, 760, 762, 763, 764

(56) References Cited

U.S. PATENT DOCUMENTS

| | | | | |
|---|---|---|---|---|
| 3,656,232 A | * | 4/1972 | Hinchey | 29/624 |
| 4,245,273 A | * | 1/1981 | Feinberg et al. | 361/382 |
| 4,468,072 A | | 8/1984 | Sadigh-Behzadi | |
| 4,518,982 A | * | 5/1985 | Du Bois et al. | 357/74 |
| 4,887,974 A | | 12/1989 | Ichimura et al. | |
| 4,988,310 A | | 1/1991 | Bright et al. | |
| 5,123,855 A | | 6/1992 | Petersen | |
| 5,367,253 A | * | 11/1994 | Wood et al. | 324/158.1 |
| 5,387,121 A | | 2/1995 | Kurz | |
| 5,475,261 A | | 12/1995 | Tanizawa | |
| 5,489,218 A | | 2/1996 | McHugh | |
| 5,543,661 A | * | 8/1996 | Sumida | 257/707 |
| 5,588,861 A | | 12/1996 | Townsend | |
| 5,597,318 A | | 1/1997 | Townsend | |
| 6,113,407 A | * | 9/2000 | Martin | 439/205 |

FOREIGN PATENT DOCUMENTS

| | | | | |
|---|---|---|---|---|
| JP | 55141063 | * | 11/1980 | 429/181 |
| JP | 59-245993 | | 6/1986 | |
| JP | 62-113608 | | 11/1988 | |

OTHER PUBLICATIONS

International Search Report application number PCT/US01/07697 mailed Dec. 4, 2001.

* cited by examiner

Primary Examiner—Anthony Dinkins
Assistant Examiner—Carmelo Oliva
(74) Attorney, Agent, or Firm—Conley, Rose & Tayon, PC; B. Noël Kivlin

(57) ABSTRACT

A semiconductor device package, and a semiconductor device employing the package, are described. The semiconductor device package is intended for housing an integrated circuit (IC), and includes a substrate adapted to receive the IC. The substrate includes a surface (e.g., an underside surface) having an outer portion surrounding a center portion. A first group of signal terminals are arranged about the outer portion of the surface, and a second group of power supply terminals are arranged about the center portion. Placing the power supply terminals in the center portion of the surface reduces the lengths of power supply current paths within the substrate, thus reducing IR voltage drops within the substrate. The power supply terminals are made physically larger than the signal terminals such that the electrical resistances of the power supply terminals are lower than the electrical resistances of the signal terminals.

21 Claims, 2 Drawing Sheets

SEMICONDUCTOR DEVICE INCLUDING AND INTEGRATED CIRCUIT HOUSED IN AN ARRAY PACKAGE HAVING SIGNAL TERMINALS ARRANGED ABOUT CENTRALLY LOCATED POWER SUPPLY TERMINALS

BACKGROUND OF THE INVENTION

1. Field of the Invention

This invention relates to semiconductor devices and, more particularly, to semiconductor devices housed in array packages having terminals arranged about surfaces of the packages.

2. Description of the Related Art

Following fabrication, an integrated circuit (IC) is typically housed in a protective semiconductor device package. As IC fabrication technology improves, manufacturers are able to integrate more and more functionality into a single IC. As the number of integrated functions increases, so do the number of signal lines which need to be connected to external devices. Accordingly, IC manufacturers are shifting from peripheral-terminal packages, with terminals arranged around a periphery of the package, to array semiconductor device packages having terminals arranged about an underside surface of the package. The physical dimensions of array device packages having hundreds of terminals are much smaller than their peripheral-terminal counterparts.

FIG. 1 is a bottom plan view of an exemplary semiconductor device 10 employing a pin grid array (PGA) device package housing an IC. The PGA package includes a substrate 12 having multiple conductive pins 14 extending outwardly from an underside surface of substrate 12. Pins 14 are provided for connecting to a printed circuit board (PCB) or for inserting into a socket. As is typical, pins 14 are arranged about an outer portion of the underside surface of the PGA package.

FIG. 2 is a cross-sectional view of semiconductor device 10 as indicated in FIG. 1. As illustrated in FIG. 2, semiconductor device 10 includes an IC 16 coupled to substrate 12 and a cover or lid 18. IC 16 is mounted upon a center portion of an upper surface of substrate 12 using the well known controlled collapse chip connection (C4) or "flip chip" method. Multiple solder bumps connect a set of I/O pads on a frontside surface of IC 16 to corresponding bonding pads on the upper surface of substrate 12. A layer 20 of a thermal interface material thermally couples a backside surface of IC 16 to an underside surface of lid 18.

Substrate 12 includes multiple horizontal layers of electrical conductors in a stacked arrangement. The electrical conductors connect pins 14 to bonding pads on the upper surface of substrate 12. Adjacent layers are electrically isolated from one another by a dielectric material used to form substrate 12. Vertical conductive vias connect electrical conductors in different layers. One or more of the horizontal layers may be patterned to form trace conductors. Signals are routed to and from IC 16 via trace conductors.

A portion of pins 14 and corresponding electrical conductors within substrate 12 are used to provide electrical power to IC 16. For example, in FIG. 2, a pin 14A and a horizontal conductor 22A may be used to supply a first reference "ground" power supply voltage to a bonding pad 24A of substrate 12. Similarly, a pin 14B and a horizontal conductor 22B may be used to supply a second power supply voltage (e.g., a "positive" power supply voltage) to a bonding pad 24B of substrate 12.

Magnitudes of power supply voltages tend to decrease as the dimensions of electronic devices formed upon IC substrates decrease. On the other hand, power supply current magnitudes tend to increase as the number of electronic devices placed on ICs increase, and as the operating frequencies of the electronic devices increase. Resistances along power supply current paths between pins 14 and bonding pads 24 of substrate 12 cause IR voltage drops in the power supply voltage, where I is the magnitude of power supply current flowing along a path and R is the electrical resistance along the path.

A problem arises in that the current carrying abilities of individual pins 14 are limited, and the relatively long power supply current paths within substrate 12 result in relatively large IR voltage drops. Due to the limited current carrying abilities of individual pins 14, the size of the portion of pins 14 dedicated to providing electrical power to IC 16 is typically substantial. In FIG. 2, power supply currents flowing through pins 14A–14B and corresponding horizontal conductors 22A–22B encounter electrical resistances of pins 14A–14B and horizontal conductors 22A–22B. These electrical resistances cause IR voltage drops in the power supply voltage provided to IC 16. As pins 14 are arranged about the outer portion of the underside surface of substrate 12, and IC 16 is mounted upon the center portion of the upper surface of substrate 12, the lengths of power supply current paths through horizontal conductors 22 are relatively long. The electrical resistance of a conductor is directly proportional to the length of the current path through the conductor. As a result, the electrical resistances of the horizontal conductors 22 are relatively high.

Further, when IC 16 transforms an appreciable amount of electrical energy into heat energy, substrate 12 is often formed from a ceramic material (e.g., aluminum oxide). Horizontal conductors 22 within ceramic substrates are typically formed from refractory metals (e.g., tungsten or molybdenum). Compared to other metals from which conductors are commonly formed, refractory metals have relatively high electrical resistivities. As the electrical resistance of a conductor is directly proportional to the electrical resistivity of the conductor, the electrical resistances of horizontal conductors 22 are typically greater in common ceramic substrates than in packages made from other materials. IR voltage drops along power supply current paths are thus greater in common ceramic substrates.

It would thus be desirable to have a semiconductor device package for housing an IC and having terminals for providing electrical power to the IC wherein the current carrying abilities of the terminals are greater than those of individual pins 14. The desired terminals would be located near the IC to reduce IR voltage drops between the terminals and the IC.

SUMMARY OF THE INVENTION

A semiconductor device package, and a semiconductor device employing the package, are described. The semiconductor device package is intended for housing an integrated circuit (IC), and includes a substrate adapted to receive the IC. The substrate includes a surface (e.g., an underside surface) having an outer portion surrounding a center portion. A first group of signal terminals are arranged about the outer portion of the surface, and a second group of power supply terminals are arranged about the center portion. Placing the power supply terminals in the center portion of the surface reduces the lengths of power supply current paths within the substrate, thus reducing IR voltage drops within the substrate. The power supply terminals are made physically larger than the signal terminals such that the electrical resistances of the power supply terminals are lower than the electrical resistances of the signal terminals.

The group of power supply terminals may include at least one set of power supply terminals, wherein each power supply terminal of each set provides a different power supply voltage to the IC. For example, the IC may require two different power supply voltages—a first reference "ground" voltage, and a second "positive" voltage which is positive with respect to the reference ground voltage. In this case, the group of power supply terminals may include any number of pairs of power supply terminals. One power supply terminal of each pair provides the reference ground voltage to the IC, and the other power supply terminal provides the positive voltage to the IC.

The signal terminals and the power supply terminals may extend outwardly from the surface of the substrate, and may be adapted for coupling to either a printed circuit board or a socket contact. The signal terminals may be cylindrical and have circular cross sections. In contrast, each power supply terminal may have one or more substantially planar surfaces. Such planar surfaces are deemed particularly suited for low-resistance coupling to socket contacts. In one embodiment, the power supply terminals may be blades having substantially rectangular cross sections.

The substrate may be formed substantially from a ceramic material. Alternately, the substrate may be formed substantially of a fiberglass-epoxy printed circuit board material or a plastic material.

The power supply terminals may be formed from an iron nickel alloy. Planar surfaces of power supply terminals may receive an outer plating of gold to reduce contact resistance with a socket contact.

The package may also include a lid which covers the integrated circuit such that the integrated circuit is housed within the package.

One embodiment of a semiconductor device includes an IC housed within the above package. The signal and power supply terminals are arranged upon an underside surface of the substrate as described above. The IC is coupled to an upper surface of the substrate, where the upper surface is opposed to the underside surface. The IC has multiple electrically conductive input/output (I/O) pads arranged about a frontside surface forming a pattern. The substrate has multiple electrically conductive bonding pads arranged about the upper surface according to the pattern. Each I/O pad of the IC is coupled to a corresponding bonding pad of the substrate (e.g., by a solder bump).

BRIEF DESCRIPTION OF THE DRAWINGS

Other objects and advantages of the invention will become apparent upon reading the following detailed description and upon reference to the accompanying drawings in which.

Figure 1:
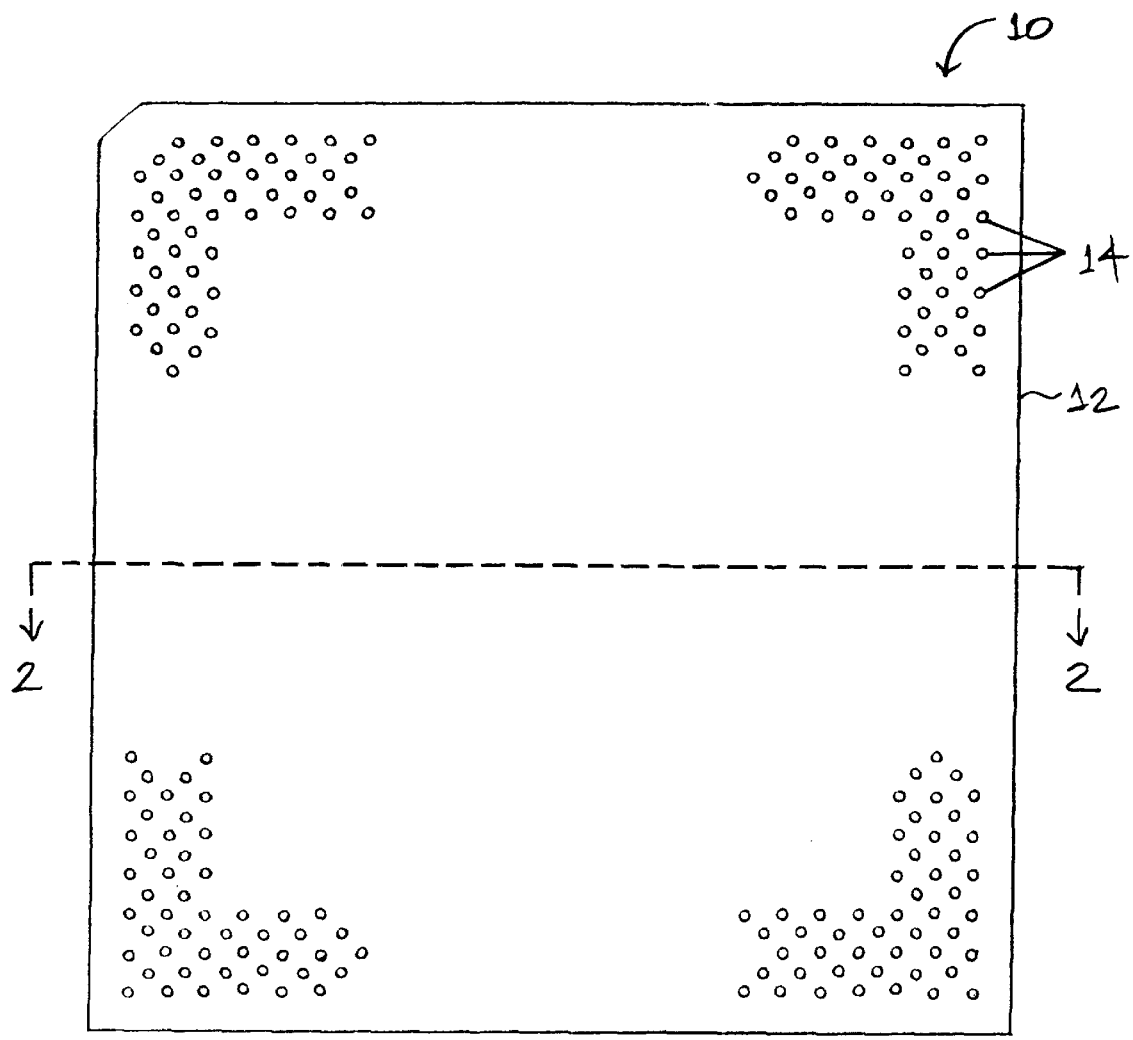
FIG. 1 is a bottom plan view of an exemplary known semiconductor device employing a pin grid array (PGA) device package housing an integrated circuit.
Figure 2:
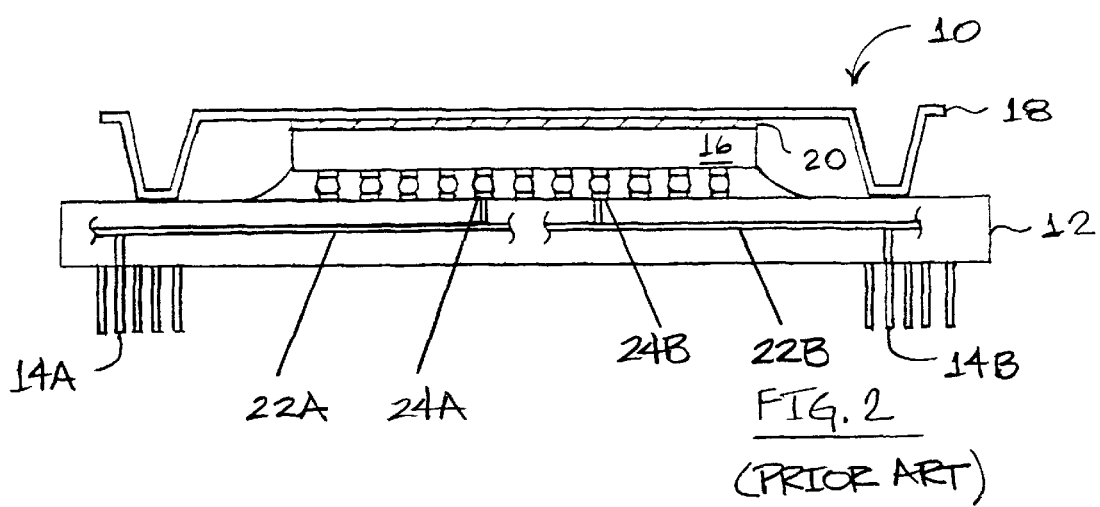
FIG. 2 is a cross-sectional view of the semiconductor device of FIG. 1.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

Figure 3:
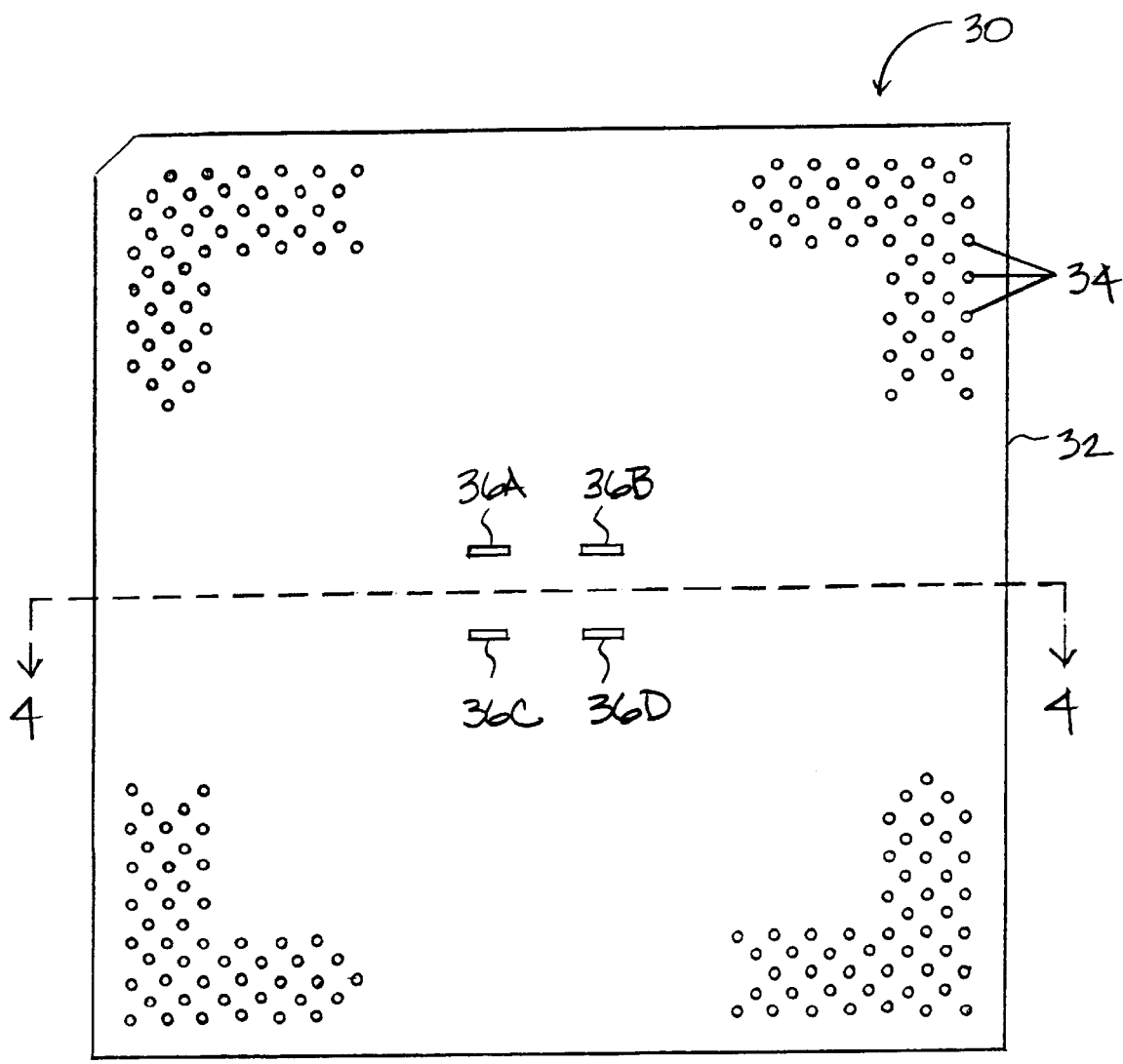
FIG. 3 is a bottom plan view of one embodiment of a semiconductor device employing a pin grid array (PGA) device package.

FIG. 3 is a bottom plan view of one embodiment of a semiconductor device 30 employing a pin grid array (PGA) device package. The PGA package includes a substrate 32 having multiple conductive pins 34 arranged about an outer portion of an underside surface of substrate 32 and extending outwardly from an underside surface of substrate 32. The PGA package also has multiple conductive blades 36A–36D arranged about a center portion of the underside surface of substrate 32 and extending outwardly from the underside surface of substrate 32. Pins 34 and blades 36 are provided for connecting to a printed circuit board (PCB) or for inserting into a socket. Pins 34 are used to convey electrical signals to and from an integrated circuit (IC) of semiconductor device 30, and blades 36 are used to provide electrical power to the IC. Blades 36 are placed in the center portion of the underside surface of substrate 32 such that the lengths of power supply current paths within substrate 32 are reduced, thus reducing IR voltage drops within substrate 32. Blades 36 are made physically larger than pins 34 such that the electrical resistances of blades 36 are lower than the electrical resistances of pins 34.

Figure 4:
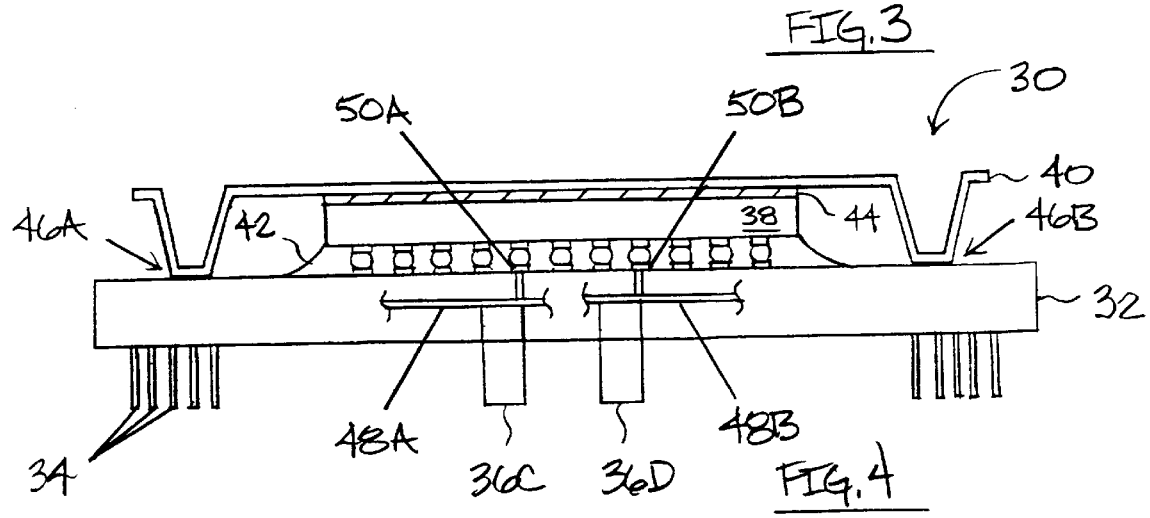
FIG. 4 is a cross-sectional view of the semiconductor device of FIG. 3.

FIG. 4 is a cross-sectional view of semiconductor device 30 as indicated in FIG. 3. As illustrated in FIG. 3, semiconductor device 30 includes an integrated circuit (IC) 38 coupled to substrate 32 and a cover or lid 40. IC 38 includes multiple I/O pads arranged upon a frontside surface. Substrate 32 has a set of corresponding bonding pads formed in a center portion of an upper surface. The set of bonding pads have substantially the same lateral dimensions as the I/O pads of IC 38, and are configured to align with the I/O pads of IC 38. IC 38 is mounted upon a center portion of an upper surface of substrate 32 using the well known controlled collapse chip connection (C4) or "flip chip" method. Solder bumps connect the set of 110 pads of IC 38 to the corresponding bonding pads of substrate 32. A layer 42 of an underfill material encapsulates the C4 connections in the region between the chip and the substrate.

A layer 44 of a thermal interface material thermally couples a backside surface of IC 38 to an underside surface of lid 40. Lid 40 is adhesively attached to the upper surface of substrate 32 at points 46A and 46B in FIG. 4. It is noted that in other embodiments of semiconductor device 30, the PGA package may not include lid 40 and/or layer 44.

Substrate 32 is preferably formed substantially of a ceramic material (e.g., aluminum oxide or aluminum nitride). Alternately, substrate 32 may be formed substantially of a fiberglass-epoxy printed circuit board material or a plastic material.

Substrate 32 includes multiple horizontal layers of electrical conductors in a stacked arrangement. The electrical conductors connect pins 34 and blades 36A–36D to bonding pads on the upper surface of substrate 32. Adjacent layers are electrically isolated from one another by the dielectric material used to form substrate 32. Vertical conductive vias connect electrical conductors in different layers. One or more of the horizontal layers may be patterned to form trace conductors. Signals are routed to and from IC 38 via trace conductors.

In the embodiment of FIGS. 3 and 4, blades 36A–36D are used to provide electrical power to IC 38, and pins 34 are used to convey electrical signals to and from IC 38. For example, blades 36A and 36C may be used to provide a first reference "ground" power supply voltage to IC 38, and blades 36B and 36D may be used to provide a second power supply voltage to IC 38. The second power supply voltage may be positive with respect to the ground power supply voltage (i.e., a "positive" power supply voltage).

In FIG. 4, blade 36C and a horizontal conductor 48A may be used to supply the first "ground" power supply voltage to a bonding pad 50A of substrate 32. Similarly, blade 36D and a horizontal conductor 48B may be used to supply the second "positive" power supply voltage to a bonding pad 50B of substrate 32.

As blades 36A–36D are arranged about the center portion of the underside surface of substrate 32, and IC 38 is mounted upon the center portion of the upper surface of substrate 32, the lengths of the power supply current paths through horizontal conductors 48 are thus relatively short. As a result, the electrical resistances of power supply current paths, and IR voltage drops, within substrate 32 may be made reduced over substrates of PGA packages in common use.

In general, semiconductor device 30 includes at least one set of blades 36, wherein each blade of the set of blades supplies a different power supply voltage to IC 38. For example, where IC 38 requires two different power supply voltages, semiconductor device 30 may include any number of pairs of blades. One blade of each pair of blades supplies one of the two different power supply voltages to IC 38, and the other blade supplies the other power supply voltage to IC 38. As shown in FIG. 3, the blades 36 of the sets are arranged about the center portion of the underside surface of substrate 32 in order to keep power supply current paths through horizontal conductors 48 of substrate 32 relatively short.

In the embodiment of FIGS. 3 and 4, pins 34 are substantially cylindrical and have substantially circular cross sections. In contrast, blades 36 are rectangular, and have two larger sides having substantially planar surfaces. A PCB or a socket contact may connect to at least one of the larger sides of each blade 36. Accordingly, in other embodiments, blades 36 may be any number of shapes in cross section as long as each blade 36 has at least one substantially planar surface adapted for connecting to a PCB or a socket contact. Such planar surfaces are deemed particularly suited for low-resistance coupling to socket contacts.

Blades 36 are preferably made of a metal. For example, blades 36 may be made of an iron nickel alloy (e.g., Kovar® or Alloy 42), and plated to prevent oxidation and/or corrosion. Where semiconductor device 30 is to be inserted into a socket, at least the planar surface of each blade 36 for connecting to a socket contact may receive an outer plating of gold to lower socket contact resistance.

Numerous variations and modifications will become apparent to those skilled in the art once the above disclosure is fully appreciated. It is intended that the following claims be interpreted to embrace all such variations and modifications.

What is claimed is:

1. A package intended for housing an integrated circuit, comprising:

a substrate including a first surface having a mounting region adapted to receive the integrated circuit;

a plurality of signal terminals for providing external electrical connectivity to the package arranged about an outer periphery of a second surface of the substrate;

a plurality of power supply terminals for providing external electrical connectivity to the package, wherein the plurality of power supply terminals is positioned directly opposite the mounting region at a center portion of the second surface; and wherein the power supply terminals are physically larger than the signal terminals.

2. The package as recited in claim 1, wherein the plurality of power supply terminals comprises at least one set of power supply terminals, wherein each power supply terminal of each set is configured to provide a different power supply voltage to the integrated circuit.

3. The package as recited in claim 1, wherein each power supply terminal has at least one substantially planar surface.

4. The package as recited in claim 1, wherein the power supply terminals are blades having substantially rectangular cross sections.

5. The package as recited in claim 1, wherein the signal terminals and the power supply terminals extend outwardly from the surface of the substrate.

6. The package as recited in claim 1, wherein the signal terminals and the power supply terminals are adapted for coupling to either a printed circuit board or a socket contact.

7. The package as recited in claim 1, wherein the substrate is formed substantially from a ceramic material.

8. The package as recited in claim 1, wherein the power supply terminals are formed from an iron nickel alloy.

9. The package as recited in claim 1, wherein each power supply terminal has at least one substantially planar surface, and wherein the at least one substantially planar surface of each power supply terminal receives an outer plating of gold.

10. A package intended for housing an integrated circuit, comprising:

a substrate having opposed first and second surfaces, wherein the first surface includes a mounting region adapted to receive the integrated circuit;

a plurality of signal terminals for providing external electrical connectivity to the package arranged about an outer periphery of the second surface;

a plurality of power supply terminals for providing external electrical connectivity to the package, wherein the plurality of power supply terminals is positioned directly opposite the mounting region at a center portion of the second surface; and wherein the power supply terminals are physically larger than the signal terminals.

11. The package as recited in claim 10, wherein the plurality of power supply terminals comprises at least one set of power supply terminals, wherein each power supply terminal of each set is configured to provide a different power supply voltage to the integrated circuit.

12. The package as recited in claim 10, wherein each power supply terminal has at least one substantially planar surface.

13. The package as recited in claim 10, wherein the power supply terminals are blades having substantially rectangular cross sections.

14. The package as recited in claim 10, wherein the signal terminals and the power supply terminals extend outwardly from the second surface of the substrate.

15. The package as recited in claim 10, wherein the integrated circuit comprises a plurality of electrically conductive input/output (I/O) pads arranged about a surface of the integrated circuit forming a pattern, and wherein the substrate comprises a plurality of electrically conductive bonding pads arranged about the first surface according to the pattern.

16. The package as recited in claim 15, wherein the substrate comprises a plurality of electrical conductors arranged in layers, and wherein the electrical conductors connect the signals terminals and the power supply terminals to the bonding pads.

17. A semiconductor device, comprising:

a substrate having opposed first and second surfaces, wherein the first surface includes a mounting region;

a plurality of signal terminals for providing external electrical connectivity to the package arranged about an outer periphery of the second surface;

a plurality of power supply terminals for providing external electrical connectivity to the package, wherein the plurality of power supply terminals is positioned directly opposite the mounting region at a center portion of the second surface;

wherein the power supply terminals are physically larger than the signal terminals; and an integrated circuit positioned on the mounting surface and electrically coupled to the plurality of signal terminals and to the plurality of power supply terminals.

18. The semiconductor device as recited in claim 17, wherein the plurality of power supply terminals comprises at least one set of power supply terminals, wherein each power supply terminal of each set is configured to provide a different power supply voltage to the integrated circuit.

19. The semiconductor device as recited in claim 17, wherein each power supply terminal has at least one substantially planar surface.

20. The semiconductor device as recited in claim 17, wherein the power supply terminals are blades having substantially rectangular cross sections.

21. The semiconductor device as recited in claim 17, wherein the signal terminals and the power supply terminals extend outwardly from the second surface of the substrate.

\* \* \* \* \*

UNITED STATES PATENT AND TRADEMARK OFFICE
CERTIFICATE OF CORRECTION

PATENT NO.    : 6,392,145 B1
DATED         : May 21, 2002
INVENTOR(S)   : Anthony Andric It is certified that error appears in the above-identified patent and that said Letters Patent is hereby corrected as shown below:

<u>Title page,</u>
Item [54], Title, please change the title to:
-- SEMICONDUCTOR DEVICE INCLUDING AN INTEGRATED CIRCUIT HOUSED IN AN ARRAY PACKAGE HAVING SIGNAL TERMINALS ARRANGED ABOUT CENTRALLY LOCATED POWER SUPPLY TERMINALS --

Signed and Sealed this

First Day of October, 2002

*Attest:*

*Attesting Officer*

JAMES E. ROGAN
*Director of the United States Patent and Trademark Office*